United States Patent
Fukunaga et al.

(10) Patent No.: US 12,377,519 B2
(45) Date of Patent: Aug. 5, 2025

(54) SUBSTRATE PROCESSING APPARATUS AND SUBSTRATE PROCESSING METHOD

(71) Applicant: Tokyo Electron Limited, Tokyo (JP)

(72) Inventors: Nobutaka Fukunaga, Kumamoto (JP); Masakazu Yarimitsu, Kumamoto (JP); Katsuhisa Fujii, Kumamoto (JP); Hidejiro Ryu, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 919 days.

(21) Appl. No.: 17/415,756

(22) PCT Filed: Dec. 6, 2019

(86) PCT No.: PCT/JP2019/047908
§ 371 (c)(1),
(2) Date: Jun. 18, 2021

(87) PCT Pub. No.: WO2020/129714
PCT Pub. Date: Jun. 25, 2020

(65) Prior Publication Data
US 2022/0080551 A1 Mar. 17, 2022

(30) Foreign Application Priority Data
Dec. 19, 2018 (JP) .................................. 2018-237690

(51) Int. Cl.
*B24B 49/04* (2006.01)
*B24B 7/22* (2006.01)
(Continued)

(52) U.S. Cl.
CPC .............. *B24B 49/04* (2013.01); *B24B 7/226* (2013.01); *B24B 41/06* (2013.01); *B24B 53/017* (2013.01)

(58) Field of Classification Search
CPC .. B24B 7/04; B24B 7/07; B24B 7/075; B24B 7/22; B24B 7/228; B24B 41/068;
(Continued)

(56) References Cited

U.S. PATENT DOCUMENTS

| | | | |
|---|---|---|---|
| 2015/0221562 A1* | 8/2015 | Torikoshi | H01L 21/67219 438/692 |
| 2017/0095902 A1* | 4/2017 | Yoshida | B24B 7/228 |
| 2020/0269383 A1 | 8/2020 | Yasuda | |

FOREIGN PATENT DOCUMENTS

| | | | |
|---|---|---|---|
| JP | 2008264913 A | * | 11/2008 |
| JP | 2009160705 A | * | 7/2009 |

(Continued)

OTHER PUBLICATIONS

JP-2008264913 Machine Translation (Year: 2008).*
(Continued)

*Primary Examiner* — Brian D Keller
*Assistant Examiner* — Alberto Saenz
(74) *Attorney, Agent, or Firm* — Shih IP Law Group, PLLC.

(57) ABSTRACT

A substrate processing apparatus includes a rotary table configured to move each of multiple substrate chucks to, in sequence, a carry-in position where a carry-in of a substrate is performed, a processing position where thinning of the substrate is performed, and a carry-out position where a carry-out of the substrate is performed; a tilt angle adjusting device configured to adjust a tilt angle of the substrate chuck with respect to the rotary table at the processing position; and a tilt angle controller configured to control the tilt angle adjusting device based on a measurement result of a plate thickness measuring device. The plate thickness measuring device measures a plate thickness of the substrate at the carry-out position.

18 Claims, 12 Drawing Sheets

(51) Int. Cl.
*B24B 41/06* (2012.01)
*B24B 53/017* (2012.01)

(58) Field of Classification Search
CPC ..... B24B 37/00; B24B 37/005; B24B 37/013;
B24B 37/04; B24B 37/042; B24B 37/10;
B24B 37/07; B24B 37/30; B24B 37/34;
B24B 37/345; B24B 49/04; B24B 49/045;
B24B 49/10; B24B 49/12; B24B 9/065;
B24B 49/02; H01L 21/304; H01L
21/6833; H01L 21/6871; H01L 21/68742;
H01L 21/68764
USPC .......................................................... 451/41
See application file for complete search history.

(56) References Cited

FOREIGN PATENT DOCUMENTS

| | | | |
|---|---|---|---|
| JP | 2013119123 A | 6/2013 | |
| TW | 201834786 A | 10/2018 | |

OTHER PUBLICATIONS

JP 2009160705—Machine Translation (Year: 2009).*
International Search Report of PCT/JP2019/047908 dated Feb. 10, 2020.

* cited by examiner

FIG. 6

|  | FIRST PROCESSING POSITION | SECOND PROCESSING POSITION | THIRD PROCESSING POSITION |
|---|---|---|---|
| SUBSTRATE CHUCK30A | Z1A,Z2A | Z1B,Z2B | Z1C,Z2C |
| SUBSTRATE CHUCK30B | Z1D,Z2D | Z1E,Z2E | Z1F,Z2F |
| SUBSTRATE CHUCK30C | Z1G,Z2G | Z1H,Z2H | Z1I,Z2I |
| SUBSTRATE CHUCK30D | Z1J,Z2J | Z1K,Z2K | Z1L,Z2L |

FIG. 7

|  | FIRST PROCESSING POSITION | SECOND PROCESSING POSITION | THIRD PROCESSING POSITION |
|---|---|---|---|
| SUBSTRATE CHUCK30A | $\alpha A, \beta A$ | $\alpha B, \beta B$ | $\alpha C, \beta C$ |
| SUBSTRATE CHUCK30B | $\alpha D, \beta D$ | $\alpha E, \beta E$ | $\alpha F, \beta F$ |
| SUBSTRATE CHUCK30C | $\alpha G, \beta G$ | $\alpha H, \beta H$ | $\alpha I, \beta I$ |
| SUBSTRATE CHUCK30D | $\alpha J, \beta J$ | $\alpha K, \beta K$ | $\alpha L, \beta L$ |

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2019/047908 filed on Dec. 6, 2019, which claims the benefit of Japanese Patent Application No. 2018-237690 filed on Dec. 19, 2018, the entire disclosures of which are incorporated herein by reference.

TECHNICAL FIELD

The various aspects and embodiments described herein pertain generally to a substrate processing apparatus and a substrate processing method.

BACKGROUND

A grinding apparatus of Patent Document 1 includes a rotary table and a plurality of substrate chucks arranged around a rotation axis of the rotary table at a regular distance therebetween. These substrate chucks are rotated around the rotation axis of the rotary table along with the rotary table.

The rotary table moves each of the plurality of substrate chucks to a holding/releasing position where holding or releasing of the holding of the substrate is performed, a first grinding position where first grinding of the substrate is performed, and a second grinding position where second grinding of the substrate is performed in sequence.

The aforementioned grinding apparatus is equipped with a finishing thickness measuring device. The finishing thickness measuring device measures, at the second grinding position, a thickness of the substrate after being subjected to the second grinding. The finishing thickness measuring device measures the thickness of the substrate at three different points of the substrate in a diametrical direction thereof.

The grinding apparatus is further equipped with a tilt angle adjusting mechanism. The tilt angle adjusting mechanism adjusts a tilt angle of the substrate chuck with respect to the rotary table based on the measurement result of the finishing thickness measuring device. Since the tilt angle of the substrate chuck with respect to a whetstone can be adjusted, a thickness distribution of the substrate in the diametrical direction thereof can be controlled.

PRIOR ART DOCUMENT

Patent Document 1: Japanese Patent Laid-open Publication No. 2008-264913

DISCLOSURE OF THE INVENTION

Means for Solving the Problems

In an exemplary embodiment, a substrate processing apparatus includes a rotary table configured to move each of multiple substrate chucks to, in sequence, a carry-in position where a carry-in of a substrate is performed, a processing position where thinning of the substrate is performed, and a carry-out position where a carry-out of the substrate is performed; a tilt angle adjusting device configured to adjust a tilt angle of the substrate chuck with respect to the rotary table at the processing position; a processing device configured to thin the substrate at the processing position; a plate thickness measuring device configured to measure, at multiple points of the substrate in a diametrical direction thereof, a plate thickness of the substrate thinned by the processing device; and a tilt angle controller configured to control the tilt angle adjusting device based on a measurement result of the plate thickness measuring device. The plate thickness measuring device measures the plate thickness of the substrate at the carry-out position.

BRIEF DESCRIPTION OF THE DRAWINGS

FIG. 6 is a diagram showing settings of parameters Z1 and Z2 indicating the tilt angle according to the exemplary embodiment.

FIG. 7 is a diagram illustrating settings of parameters $\alpha$ and $\beta$ indicating the tilt angle according to the exemplary embodiment.

DETAILED DESCRIPTION

Figure 1:
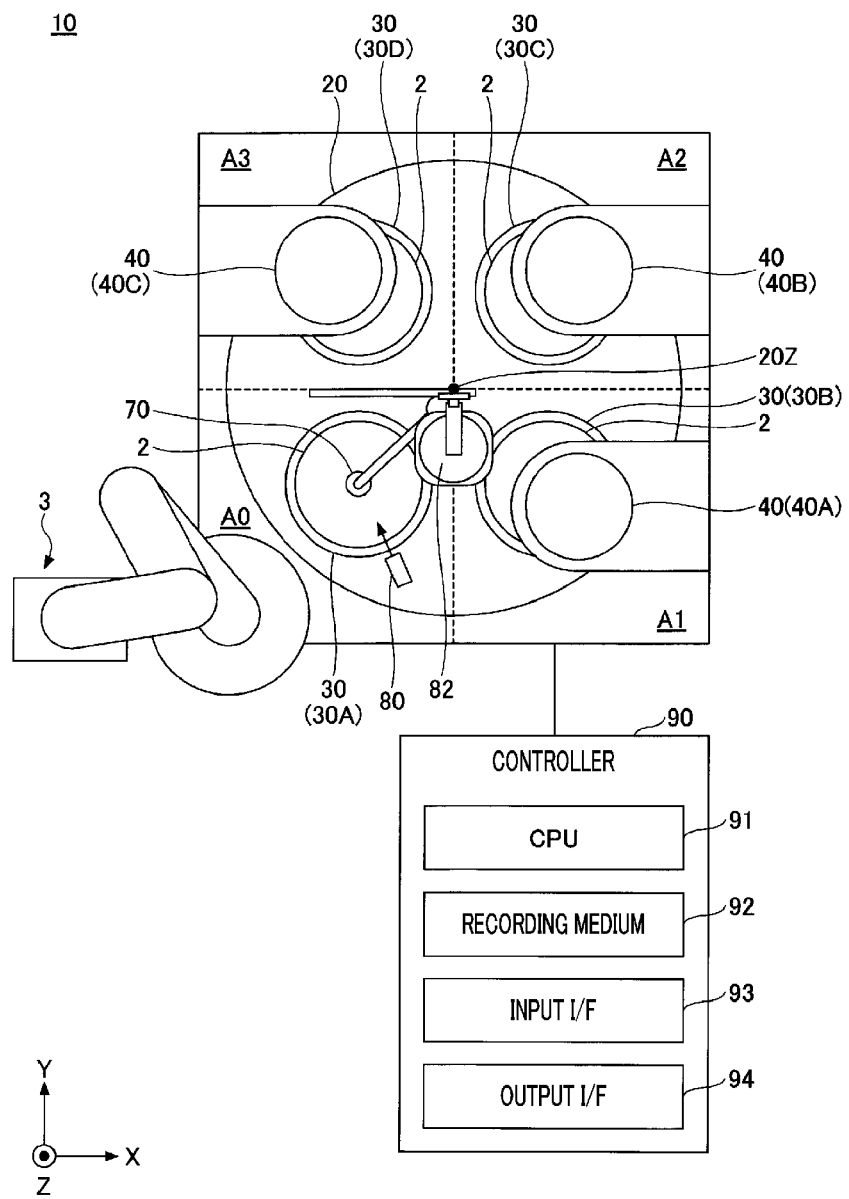
FIG. 1 is a plan view illustrating a substrate processing apparatus according to an exemplary embodiment.

Hereinafter, exemplary embodiments of the present disclosure will be described with reference to the accompanying drawings. In the various drawings, same or corresponding parts will be assigned same or corresponding reference numerals, and redundant description will be omitted. In the present specification, the X-axis direction, the Y-axis direction and the Z-axis direction are orthogonal to each other. The X-axis and Y-axis directions are horizontal directions, and the Z-axis direction is a vertical direction.

FIG. 1 is a plan view illustrating a substrate processing apparatus according to an exemplary embodiment. The substrate processing apparatus 10 is configured to perform thinning of a substrate 2. The substrate 2 is, for example, a semiconductor substrate such as a silicon wafer. The substrate processing apparatus 10 includes a rotary table 20, four substrate chucks 30A to 30D, and three processing devices 40A to 40C. Further, the number of the processing devices 40 is not limited to three as long as at least one processing device is provided. Furthermore, the number of the substrate chucks 30 is not limited to four, either, as long as it is more than the number of the processing devices 40.

The rotary table 20 is rotated around a rotation axis 20Z thereof. The rotation axis 20Z of the rotary table 20 is vertically elongated, for example. The four substrate chucks 30A to 30D are arranged around the rotation axis 20Z of the rotary table 20 at a regular distance therebetween. Each of the four substrate chucks 30A to 30D is rotated along with the rotary table 20, and moved to a carry-in/out position A0, a first processing position A1, a second processing position A2 and a third processing position A3, and back to the carry-in/out position A0 in this sequence.

The carry-in/out position A0 serves as a carry-in position where a carry-in of the substrate 2 is performed and a carry-out position where a carry-out of the substrate 2 is performed. The carry-in and the carry out of the substrate 2 are performed by a transfer robot 3. Further, though the carry-in position and the carry-out position are identical in the present exemplary embodiment, they may be different.

If the substrate 2 is carried in by the transfer robot 3, the substrate chuck 30 is configured to hold the substrate 2. A non-illustrated protection tape is previously attached to a surface (for example, a bottom surface) of the substrate 2 facing the substrate chuck 30. The protection tape protects devices formed on the bottom surface of the substrate 2 in advance. One generally used may be utilized as the protection tape. For example, a resin tape may be used. The transfer robot 3 is configured to perform the carry-in/carry-out of the substrate 2 protected by the protection tape.

The first processing position A1 is a processing position where the thinning of the substrate 2 is performed. The substrate 2 is thinned by the first processing device 40A at the first processing position A1. This thinning is a first processing. The first processing may be, by way of example, grinding.

The second processing position A2 is a processing position where the substrate 2 thinned at the first processing position A1 is further thinned. The substrate 2 is thinned by the second processing device 40B at the second processing position A2. This thinning is a second processing. The second processing may be, for example, grinding. A particle size of a whetstone used in the second processing is smaller than a particle size of a whetstone used in the first processing.

The third processing position A3 is a processing position where the substrate 2 thinned at the second processing position A2 is further thinned. The substrate 2 is thinned by the third processing device 40C at the third processing position A3. This thinning is a third processing. The third processing may be either grinding or polishing. A particle size of a whetstone used in the third processing is smaller than the particle size of the whetstone used in the second processing.

Figure 2:
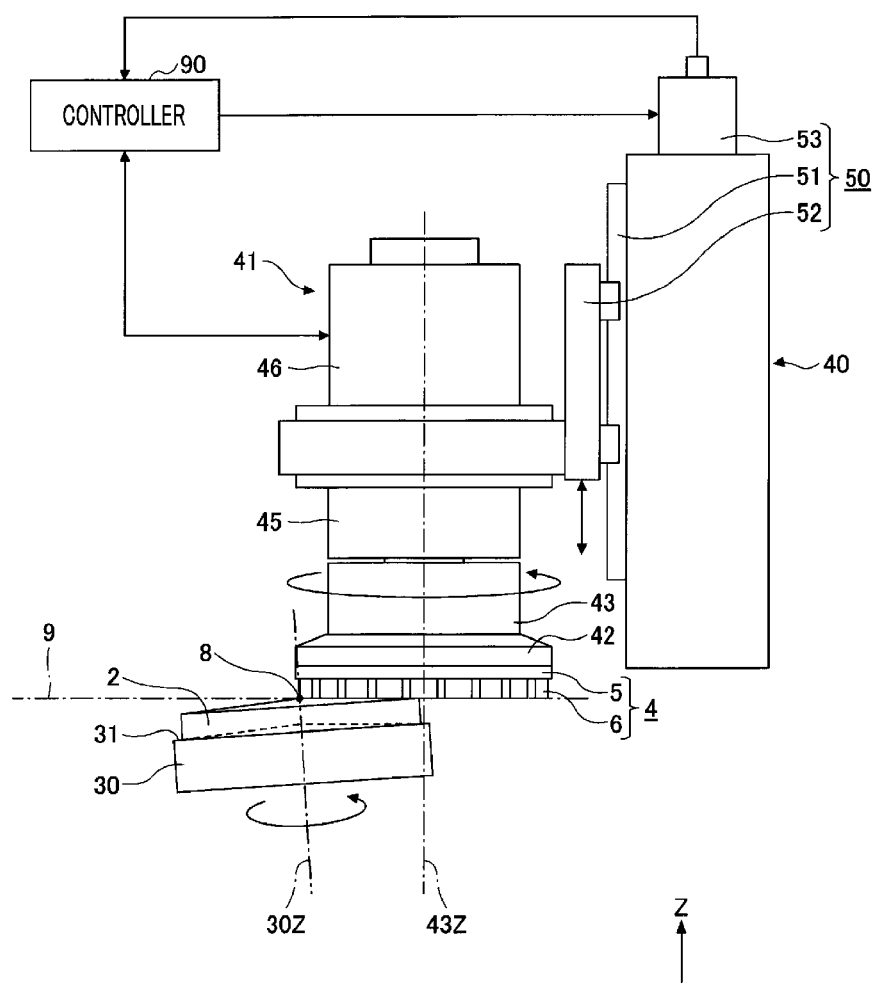
FIG. 2 is a side view illustrating a processing device according to the exemplary embodiment.

The four substrate chucks 30A to 30D are provided to the rotary table 20 so as to be rotatable around their own rotation axes 30Z (see FIG. 2). The rotation of each of the substrate chucks 30A to 30D around the rotation axis 30Z is performed while the thinning of the substrate 2 is being performed. While the thinning of the substrate 2 is being performed, the rotation of the rotary table 20 around the rotation axis 20Z is not performed.

FIG. 2 is a side view illustrating the processing device according to the exemplary embodiment. The processing device 40 is configured to perform the thinning of the substrate 2. The processing device 40 is equipped with: an operating unit 41 to which a tool 4 is attached in a replaceable manner; and a moving/driving unit 50 configured to move the operating unit 41 in a direction parallel to the rotation axis 20Z of the rotary table 20 (for example, the Z-axis direction).

The tool 4 is brought into contact with the substrate 2 and is configured to thin the substrate 2. By way of example, the tool 4 includes a disk-shaped wheel 5 and a plurality of whetstones 6 fixed to a surface (for example, a bottom surface) of the wheel 5 facing the substrate chuck 30. The plurality of whetstones 6 are arranged on a peripheral portion of the bottom surface of the wheel 5 in a ring shape. These whetstones 6 are placed on a single horizontal plane 9.

Figure 3:
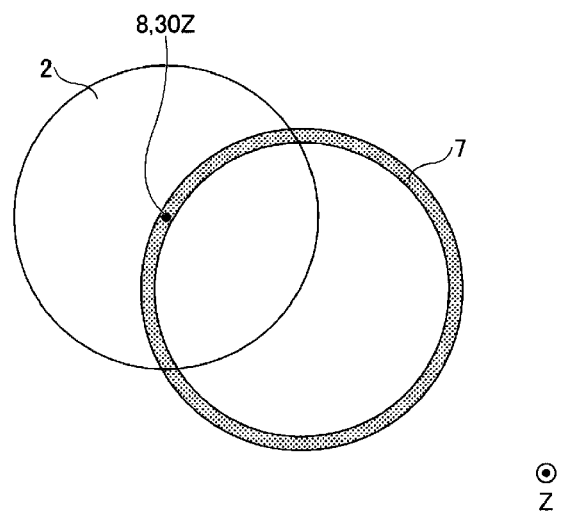
FIG. 3 is a plan view showing a relationship between a substrate and a trajectory of a whetstone according to the exemplary embodiment.

FIG. 3 is a plan view showing a relationship between the substrate and a trajectory of the whetstone according to the exemplary embodiment. As depicted in FIG. 3, a trajectory 7 of the plurality of whetstones 6 arranged in the ring shape is set to pass through a center 8 of a top surface of the substrate 2. Further, the substrate 2 is attracted to the substrate chuck 30 such that the center 8 of the top surface of the substrate 2 lies on the rotation axis 30Z of the substrate chuck 30. As the substrate 2 is rotated around the rotation axis 30Z of the substrate chuck 30 along with the substrate chuck 30, the entire top surface of the substrate 2 is processed by the whetstones 6.

Though the plurality of whetstones 6 are arranged on the peripheral portion of the bottom surface of the wheel 5 in the ring shape in the present exemplary embodiment, the present disclosure is not limited thereto. The whetstones 6 may be fixed to the entire bottom surface of the wheel 5.

The operating unit 41 includes, as illustrated in FIG. 2, for example, a flange 42 to which the tool 4 is attached in the replaceable manner, a spindle shaft 43 having the flange 42 at an end thereof, a shaft bearing 45 configured to support the spindle shaft 43 in a rotatable manner, and a spindle motor 46 configured to rotate the spindle shaft 43. The spindle motor 46 rotates the spindle shaft 43, thus allowing the flange 42 and the tool 4 to be rotated. A rotation axis 43Z of the spindle shaft 43 is parallel to the rotation axis 20Z of the rotary table 20 and is vertically elongated, for example.

The moving/driving unit 50 is configured to move the operating unit 41 in the direction parallel to the rotation axis 20Z of the rotary table 20 (for example, the Z-axis direction). The moving/driving unit 50 is equipped with a guide 51 elongated in the Z-axis direction, a slider 52 configured to be moved along the guide 51, and a motor 53 configured to move the slider 52. The operating unit 41 is fixed to the slider 52. The motor 53 may be of a rotary motion type or a linear motion type. If the motor 53 makes a rotary movement, the moving/driving unit 50 has a ball screw which transduces the rotary movement of the motor 53 to a linear movement of the slider 52.

The moving/driving unit 50 lowers the operating unit 41, thus allowing the tool 4 fixed to the operating unit 41 to be lowered. The tool 4 is lowered while being rotated. While the tool 4 is lowered while being rotated, the substrate chuck 30 is rotated, and the substrate 2 is rotated along with the substrate chuck 30. The tool 4 is lowered while being rotated, and comes into contact with the substrate 2 to thin the substrate 2. If a plate thickness of the substrate 2 reaches a set value, the moving/driving unit 50 stops the lowering of the operating unit 41, and thus stops the lowering of the tool 4. At this time, the rotation of the tool 4 is carried on without being stopped. Then, the moving/driving unit 50 raises the operating unit 41, thus allowing the tool 4 to be distanced away from the substrate 2.

Figure 4:
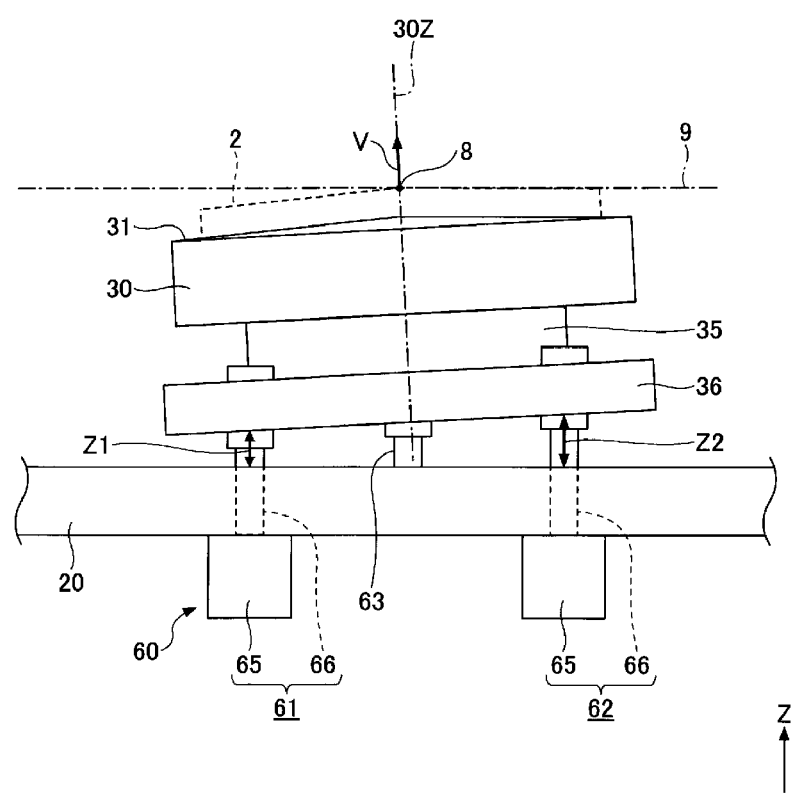
FIG. 4 is a diagram illustrating a tilt angle adjusting device according to the exemplary embodiment.

FIG. 4 is diagram illustrating a tilt angle adjusting device according to the exemplary embodiment. As depicted in FIG. 4, the substrate processing apparatus 10 is equipped with a tilt angle adjusting device 60 configured to adjust a tilt angle of the substrate chuck 30 with respect to the rotary table 20. The tilt angle adjusting device 60 is provided at each substrate chuck 30, and adjusts the tilt angle of each corresponding substrate chuck 30.

Here, the tilt angle implies a tilt angle of the rotation axis 30Z of the substrate chuck 30 with respect to the rotation axis 20Z of the rotary table 20. In case that the rotation axis 20Z of the rotary table 20 is vertically elongated, it implies a tilt angle of the rotation axis 30Z of the substrate chuck 30 with respect to the Z-axis.

Figure 5:
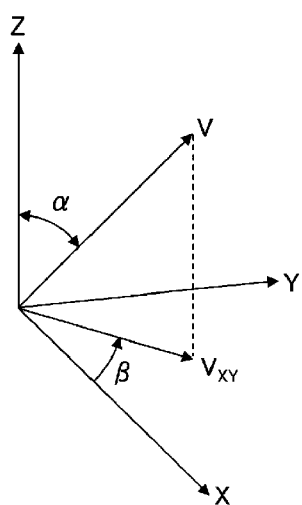
FIG. 5 is an explanatory diagram for describing a tilt angle according to the exemplary embodiment.

FIG. 5 is an explanatory diagram for describing the tilt angle according to the exemplary embodiment. The tilt angle is defined by, for example, $\alpha$ and $\beta$. Here, $\alpha$ is a magnitude of an angle formed between a vector V set on the rotation axis 30Z of the substrate chuck 30 and the Z-axis. $\beta$ is a rotation angle of a vector $V_{XY}$, which is a projection of the vector V onto a XY plane perpendicular to the Z-axis, from the X-axis.

The substrate chuck 30 is provided to the rotary table 20 with a support 35 and the tilt angle adjusting device 60 therebetween, as depicted in FIG. 4. The support 35 supports the substrate chuck 30 in a rotatable manner. The support 35 has therein a motor configured to rotate the substrate chuck 30 around the rotation axis 30Z thereof. The support 35 has a flange 36 formed thereat.

The tilt angle adjusting device 60 includes three connectors 61 to 63 arranged around the rotation axis 30Z of the substrate chuck 30 at a regular distance (for example, at an angular distance of 120°) therebetween. The three connectors 61 to 63 connect the flange 36 of the support 35 and the rotary table 20.

The two connectors 61 and 62 are configured to move the substrate chuck 30 relative to the rotary table 20 in the direction parallel to the rotation axis 20Z of the rotary table 20 (for example, the Z-axis direction). The other connector 63 fixes the substrate chuck 30 to the rotary table 20.

Each of the two connectors 61 and 62 has a motor 65 and a motion transducer 66 configured to transduce a rotary movement of the motor 65 to a linear movement of the flange 36 of the support 35. The motion transducer 66 includes, for example, a ball screw.

The two connectors 61 and 62 adjust the tilt angle by adjusting distances Z1 and Z2 between the flange 36 of the support 35 and the rotary table 20, respectively. As parameters indicating the tilt angle, a combination of the Z1 and the Z2 may be used instead of the combination of the $\alpha$ and the $\beta$.

The substrate chuck 30 has a holding surface 31 on which the substrate 2 is held. The holding surface 31 holds the substrate 2 from below it. The holding surface 31 is of a circular shape having a diameter larger than a diameter of the substrate 2. The substrate 2 is attracted onto the holding surface 31 to be arranged concentrically with the holding surface 31. The substrate 2 is attracted to the holding surface 31 such that an intersection point between the holding surface 31 and the rotation axis 30Z coincides with the center of the substrate 2.

Although the holding surface 31 of the substrate chuck 30 looks like a flat surface, it is precisely a conical surface symmetrical with respect to the rotation axis 30Z of the substrate chuck 30 as illustrated in FIG. 2 and FIG. 4 emphatically. Since the holding surface 31 of the substrate 30 is the conical surface, a plate thickness distribution of the substrate 2 can be adjusted in various ways through the adjustment of the tilt angle.

If the tilt angle is changed, a distribution of a contact pressure between the substrate 2 and the whetstones 6 on the trajectory of the whetstones 6 shown in FIG. 3 is also changed. At a position where the contact pressure is high, the thinning of the substrate 2 progresses more, as compared to a position where the contact pressure is low. Thus, by adjusting the tilt angle, the plate thickness distribution of the substrate 2 in the diametrical direction thereof can be adjusted.

FIG. 6 is a diagram showing settings of the parameters Z1 and Z2 indicating the tilt angle according to the exemplary embodiment. FIG. 7 is a diagram showing settings of the parameters $\alpha$ and $\beta$ indicating the tilt angle according to the exemplary embodiment. As shown in FIG. 6 and FIG. 7, the setting of the parameters indicating the tilt angle is performed for each substrate chuck 30. The reason why the tilt angle is set for each substrate chuck 30 is because the individual substrate chucks 30 are provided to the rotary table 20 separately and, thus, the substrate chucks 30 have different installation errors.

As depicted in FIG. 6 and FIG. 7, the setting of the parameters indicating the tilt angle is performed for each of the processing positions A1 to A3. The reason why the tilt angle is set for each of the processing positions A1 to A3 is because the individual processing devices 40 have the separate spindle shafts 43 and these spindle shafts 43 have different degrees of parallelism between the rotation axis 43Z of the spindle shaft 43 and the rotation axis 20Z of the rotary table 20.

Figure 8:
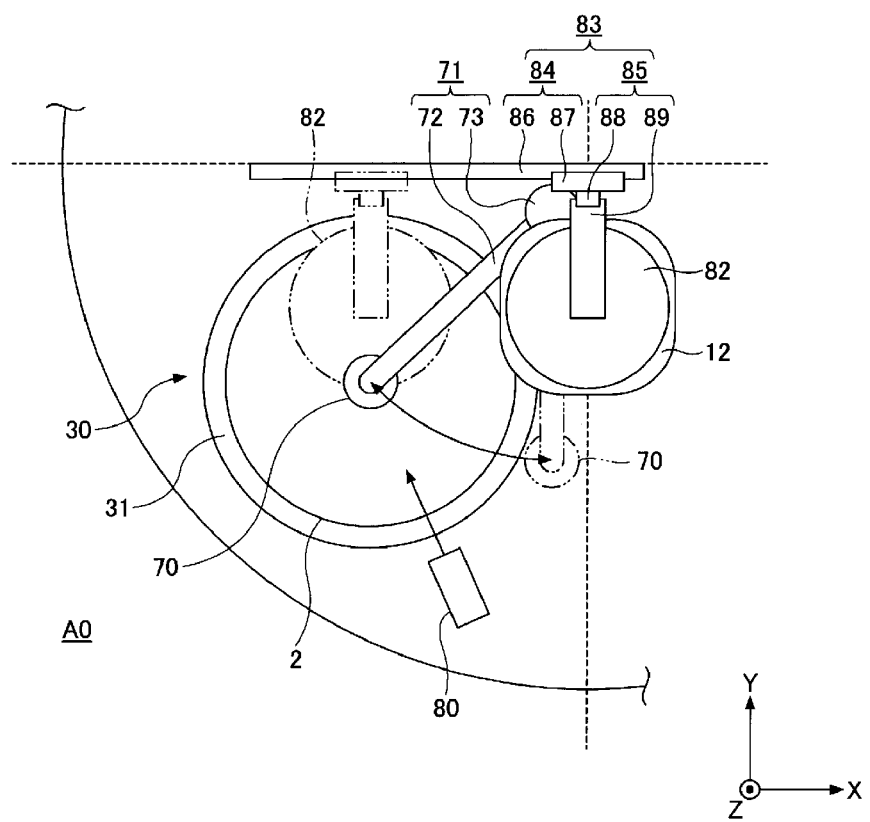
FIG. 8 is a plan view illustrating a plate thickness measuring device, a substrate cleaning device and a chuck cleaning device according to the exemplary embodiment.
Figure 9:
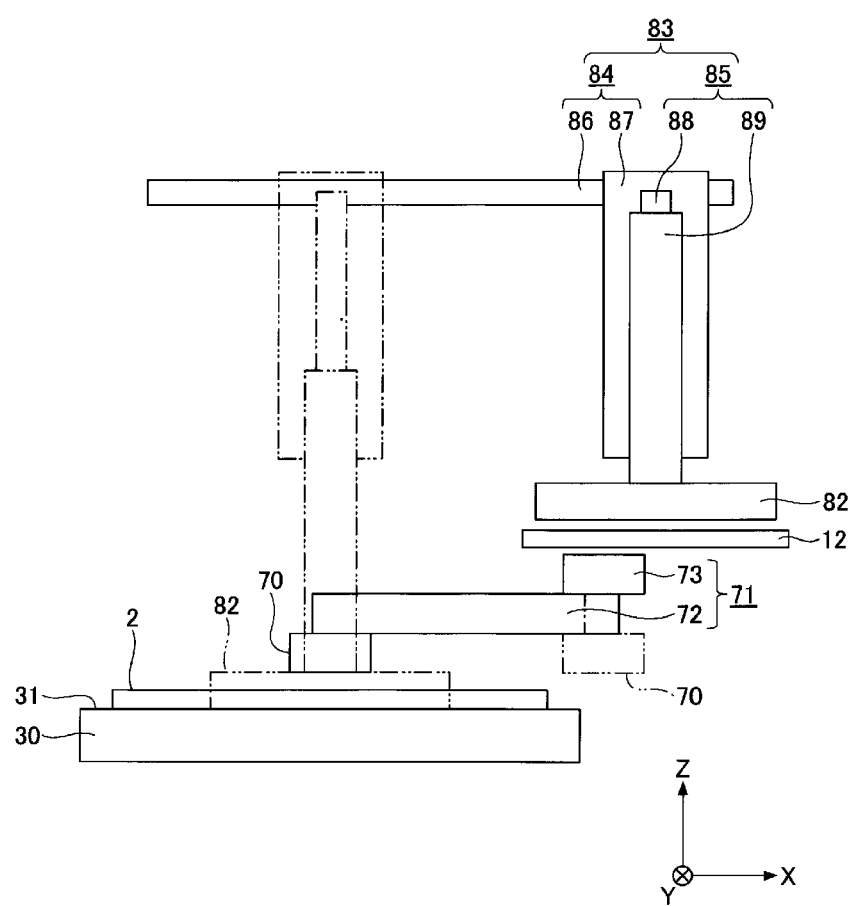
FIG. 9 is a side view illustrating the plate thickness measuring device and the chuck cleaning device according to the exemplary embodiment.

FIG. 8 is a plan view illustrating a plate thickness measuring device, a substrate cleaning device and a chuck cleaning device according to the exemplary embodiment. FIG. 9 is a side view illustrating the plate thickness measuring device and the chuck cleaning device. In FIG. 9, illustration of the substrate cleaning device shown in FIG. 8 is omitted.

The substrate processing apparatus 10 is equipped with a plate thickness measuring device 70 configured to measure a plate thickness of the thinned substrate 2 at multiple points of the substrate 2 in the diametrical direction thereof. The plate thickness measuring device 70 is, by way of non-limiting example, a non-contact type laser displacement sensor. The plate thickness measuring device 70 is configured to perform the measurement of the plate thickness of the substrate 2 at the carry-in/out position A0. By performing the measurement of the plate thickness of the substrate 2 at the carry-in/out position A0, the number of substrates 2 processed per unit time can be increased, as will be described later in detail.

The carry-in/out position A0 serves as both the carry-in position and the carry-out position, as stated above. Further, although the carry-in position and the carry-out position are identical in the present exemplary embodiment, they may be different positions. When the carry-in position and the carry-out position are different, the plate thickness measuring device 70 measures the plate thickness of the substrate 2 at the carry-out position. By performing the measurement of the plate thickness of the substrate 2 at the carry-out position, the number of substrates 2 processed per unit time can be increased, as will be elaborated later.

The substrate processing apparatus 10 is equipped with a plate thickness measuring device moving device 71 configured to move the plate thickness measuring device 70 between a measurement position indicated by a solid line in FIG. 8 and FIG. 9 and a measurement standby position indicated by a dashed double-dotted line in FIG. 8 and FIG. 9. The measurement position is a position where the plate thickness measuring device 70 measures the plate thickness of the substrate 2. The measurement position is set to be, for example, the center of the substrate chuck 30 when viewed from the vertical direction, as illustrated in FIG. 8. Meanwhile, the measurement standby position is a position where the plate thickness measuring device 70 stands by to avoid a cleaning liquid which cleans the substrate 2. The measurement standby position is set to be, for example, an outside of the substrate chuck 30 when viewed from the vertical direction, as indicated by the dashed double-dotted line in FIG. 8.

The plate thickness measuring device moving device 71 allows the plate thickness measuring device 70 to stand by at the measurement standby position when cleaning of the substrate 2 is performed. Accordingly, adhesion of the cleaning liquid to the plate thickness measuring device 70 can be suppressed. Therefore, degradation of measurement accuracy of the plate thickness measuring device 70 and breakdown of the plate thickness measuring device 70 can be suppressed.

The plate thickness measuring device moving device 71 includes, for example, a revolving arm 72 configured to hold the plate thickness measuring device 70 and a revolving motor 73 configured to revolve the revolving arm 72. The revolving arm 72 is horizontally elongated and holds the plate thickness measuring device 70 at a leading end thereof. The revolving arm 72 is revolved on a base end thereof. The plate thickness measuring device 70 measures the plate thickness of the center of the substrate 2 at the measurement position indicated by the solid line in FIG. 8 and FIG. 9.

The plate thickness measuring device 70 can be stopped at any position between the measurement position indicated by the solid line in FIG. 8 and FIG. 9 and the measurement standby position indicated by the dashed double-dotted line in FIG. 8 and FIG. 9. That is, another measurement position can be set between the measurement position indicated by the solid line in FIG. 8 and FIG. 9 and the measurement standby position indicated by the dashed double-dotted line in FIG. 8 and FIG. 9. This another measurement position may be, by way of non-limiting example, a position where a plate thickness of a middle portion of the substrate 2 between the center and a periphery thereof is measured, or a position where a plate thickness of the periphery of the substrate 2 is measured. The plate thickness measuring device 70 is capable of measuring the plate thickness of the substrates 2 at the multiple points in the diametrical direction of the substrate 2.

Further, the number of the plate thickness measuring device 70 is not limited to one. For example, a plurality of plate thickness measuring devices 70 may be arranged along a lengthwise direction of the revolving arm 72 at a regular distance therebetween. With this configuration, the plate thickness of the substrate 2 can be measured at multiple points in the diametrical direction of the substrate 2 at the same time. These plate thickness measuring devices 70 are revolved along with the revolving arm 72. By setting the plurality of plate thickness measuring devices 70 to stand by at the measurement standby position when the cleaning of the substrate 2 is performed, the adhesion of the cleaning liquid to these plate thickness measuring devices 70 can be suppressed. Therefore, the degradation of the measurement accuracy of the plate thickness measuring devices 70 and the breakdown of these plate thickness measuring devices 70 can be suppressed.

In addition, the configuration of the plate thickness measuring device moving device 71 is not particularly limited. The plate thickness measuring device moving device 71 may have a guide rail and a linearly moving mechanism instead of the revolving arm 72 and the revolving motor 73. In this configuration, the guide rail is horizontally elongated, and the linearly moving mechanism moves the plate thickness measuring device 70 along the guide rail.

The substrate processing apparatus 10 is further equipped with a substrate cleaning device 80 configured to clean the thinned substrate 2 at the carry-in/out position A0. As stated above, the carry-in/out position A0 is used as both the carry-in position and the carry-out position. Further, although the carry-in position and the carry-out position are identical in the present exemplary embodiment, they may be different positions. When the carry-in position and the carry-out position are different, the substrate cleaning device 80 cleans the substrate 2 at the carry-out position. The substrate 2 can be carried out after a processing residue produced when the thinning is performed is removed from the substrate 2.

The substrate cleaning device 80 is equipped with a nozzle through which the cleaning liquid is discharged. The nozzle is configured to discharge the cleaning liquid from an outside of the substrate 2 toward an inside of the substrate 2 in the diametrical direction thereof. By way of example, DIW (deionized water) or the like is used as the cleaning liquid. By supplying the cleaning liquid onto the substrate 2 from the nozzle while rotating the substrate 2 along with the substrate chuck 30, the entire top surface of the substrate 2 is cleaned. The nozzle may be a dual-fluid nozzle configured to discharge a mixture of the cleaning liquid and a gas. Further, in the substrate cleaning device 80, the nozzle for the cleaning liquid may be disposed adjacent to the plate thickness measuring device 70 by being provided to the revolving arm 72 which holds the plate thickness measuring device 70. In this case, when the cleaning liquid is supplied to the substrate 2 from the nozzle, water for protecting a detector of the plate thickness measuring device 70 is also supplied from the plate thickness measuring device 70. This water for protecting the detector serves to suppress the adhesion of the cleaning liquid to the plate thickness measuring device 70. Therefore, the degradation of the measurement accuracy of the plate thickness measuring device 70 and the breakdown of the plate thickness measuring device 70 can be suppressed.

The substrate processing apparatus 10 is equipped with a chuck cleaning device 82 configured to clean the substrate chuck 30 at the carry-in/out position A0 after the thinned substrate 2 is carried out. The chuck cleaning device 82 is configured to clean the holding surface 31 of the substrate chuck 30. The cleaning may be, by way of non-limiting example, scrub cleaning. The scrub cleaning is a cleaning in which a solid is brought into contact with the holding surface 31 of the substrate chuck 30 and the holding surface 31 is scrubbed.

The chuck cleaning device 82 may be, by way of example, but not limitation, a disk brush. Alternatively, a roll brush may be used instead of the disk brush. Still alternatively, a sponge or the like may be used instead of the brush. In any of these cases, the processing residue attached to the substrate chuck 30 can be removed. During the cleaning of the substrate chuck 30, the substrate cleaning device 80 may supply the cleaning liquid onto the substrate chuck 30.

The carry-in/out position A0 serves as both the carry-in position and the carry-out position, as stated above. Further, although the carry-in position and the carry-out position are identical in the present exemplary embodiment, they may be different positions. When the carry-in position and the carry-out position are different, the chuck cleaning device 82 may clean the substrate chuck 30 at either one of the carry-in position and the carry-out position. Since a new substrate 2 is attracted by the cleaned substrate chuck 30, formation of a flaw on the substrate 2 can be suppressed.

The substrate processing apparatus 10 is equipped with a chuck cleaning device moving device 83 configured to move the chuck cleaning device 82 between a cleaning position indicated by a dashed double-dotted line in FIG. 8 and FIG. 9 and a cleaning standby position indicated by a solid line in FIG. 8 and FIG. 9. The cleaning position is position where the chuck cleaning device 82 cleans the substrate chuck 30. The cleaning standby position is a position where the chuck cleaning device 82 stands by to avoid the plate thickness measuring device 70 when the plate thickness of the substrate 2 is measured. A receiving plate 12 is placed under the chuck cleaning device 82 which stands by at the cleaning standby position. The receiving plate 12 receives droplets of the cleaning liquid from the chuck cleaning device 82. The plate thickness measuring device 70 and the chuck cleaning device 82 can be placed above the substrate chuck 30 in sequence by the plate thickness measuring device moving device 71 and the chuck cleaning device moving device 83. Thus, the plate thickness measurement and the chuck cleaning can be performed at the one and the same carry-in/out position A0.

Moreover, the plate thickness measuring device moving device 71 allows the plate thickness measuring device 70 to stand by at the measurement standby position indicated by the dashed double-dotted line in FIG. 8 and FIG. 9 when the cleaning of the substrate chuck 30 is performed. Accordingly, the adhesion of the cleaning liquid to the plate thickness measuring device 70 can be suppressed. Therefore, the degradation of the measurement accuracy of the plate thickness measuring device 70 and the breakdown of the plate thickness measuring device 70 can be suppressed.

The chuck cleaning device moving device 83 includes, for example, a horizontal moving device 84 configured to move the chuck cleaning device 82 in the horizontal direction and a vertical moving device 85 configured to move the chuck cleaning device 82 in the vertical direction.

The horizontal moving device 84 is equipped with an X-axis guide 86 elongated in the X-axis direction and an X-axis slider 87 configured to be moved along the X-axis guide 86. The chuck cleaning device 82 is moved in the X-axis direction along with the X-axis slider 87. Further, though the horizontal moving device 84 of the present exemplary embodiment is configured to move the chuck cleaning device 82 in the X-axis direction, it may move the chuck cleaning device 82 in the Y-axis direction or in the X-axis and the Y-axis directions both.

The vertical moving device 85 is equipped with a Z-axis guide 88 elongated in the Z-axis direction and a Z-axis slider 89 configured to be moved along the Z-axis guide 88. The Z-axis guide 88 is fixed to the X-axis slider 87. The chuck cleaning device 82 is moved in the Z-axis direction along with the Z-axis slider 89. Further, instead of the configuration in which the Z-axis guide 88 is fixed to the X-axis slider 87, the X-axis guide 86 may be fixed to the Z-axis slider 89.

As depicted in FIG. 1, the substrate processing apparatus 10 is equipped with a controller 90. The controller 90 is implemented by, for example, a computer, and includes a CPU (Central Processing Unit) 91 and a recording medium 92 such as a memory. The recording medium 92 stores a program for controlling various processings performed in the substrate processing apparatus 10. The controller 90 controls an operation of the substrate processing apparatus 10 by allowing the CPU 91 to execute the program stored in the recording medium 92. Further, the controller 90 further includes an input interface 93 and an output interface 94. The controller 90 receives a signal from the outside through the input interface 93, and transmits a signal to the outside through the output interface 94.

The program may be recorded on a computer-readable recording medium and installed from this recording medium to the recording medium 92 of the controller 90. The computer-readable recording medium may be, by way of non-limiting example, a hard disk (HD), a flexible disk (FD), a compact disk (CD), a magnet optical disk (MO), a memory card, or the like. Further, the program may be installed on the recording medium 92 of the controller 90 by being downloaded from a server through Internet.

Figure 10:
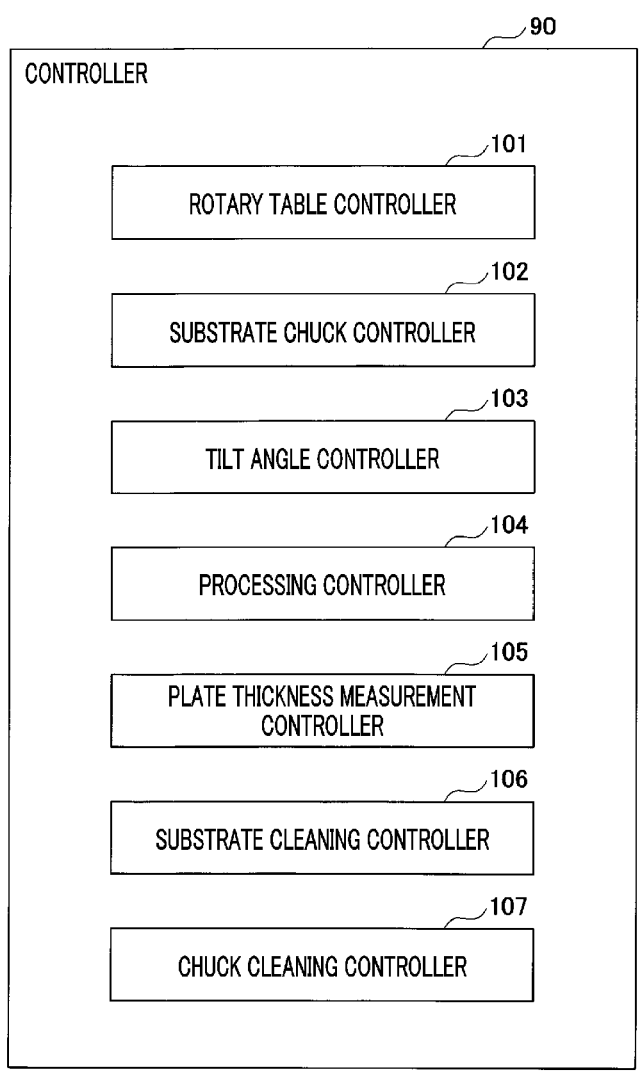
FIG. 10 is a functional block diagram illustrating constituent components of a controller according to the exemplary embodiment.

FIG. 10 is a functional block diagram illustrating constituent components of the controller according to the exemplary embodiment. Individual functional blocks shown in FIG. 10 are conceptual and may not necessarily be physically configured exactly the same as shown in FIG. 10. All or a part of the functional blocks may be functionally or physically dispersed or combined on a unit. All or a part of processing functions performed in the respective functional blocks may be implemented by a program executed by the CPU or implemented by hardware through a wired logic.

The controller 90 includes a rotary table controller 101, a substrate chuck controller 102, a tilt angle controller 103, a processing controller 104, a plate thickness measurement controller 105, a substrate cleaning controller 106, and a chuck cleaning controller 107. The rotary table controller 101 controls the rotation of the rotary table 20 around the rotation axis 20Z thereof. The substrate chuck controller 102 controls the rotation of the substrate chuck 30 around the rotation axis 30Z thereof. The tilt angle controller 103 controls the tilt angle adjusting device 60. The processing controller 104 controls the processing device 40. The plate thickness measurement controller 105 controls the plate thickness measuring device 70 and the plate thickness measuring device moving device 71. The substrate cleaning controller 106 controls the substrate cleaning device 80. The chuck cleaning controller 107 controls the chuck cleaning device 82 and the chuck cleaning device moving device 83.

Figure 11:
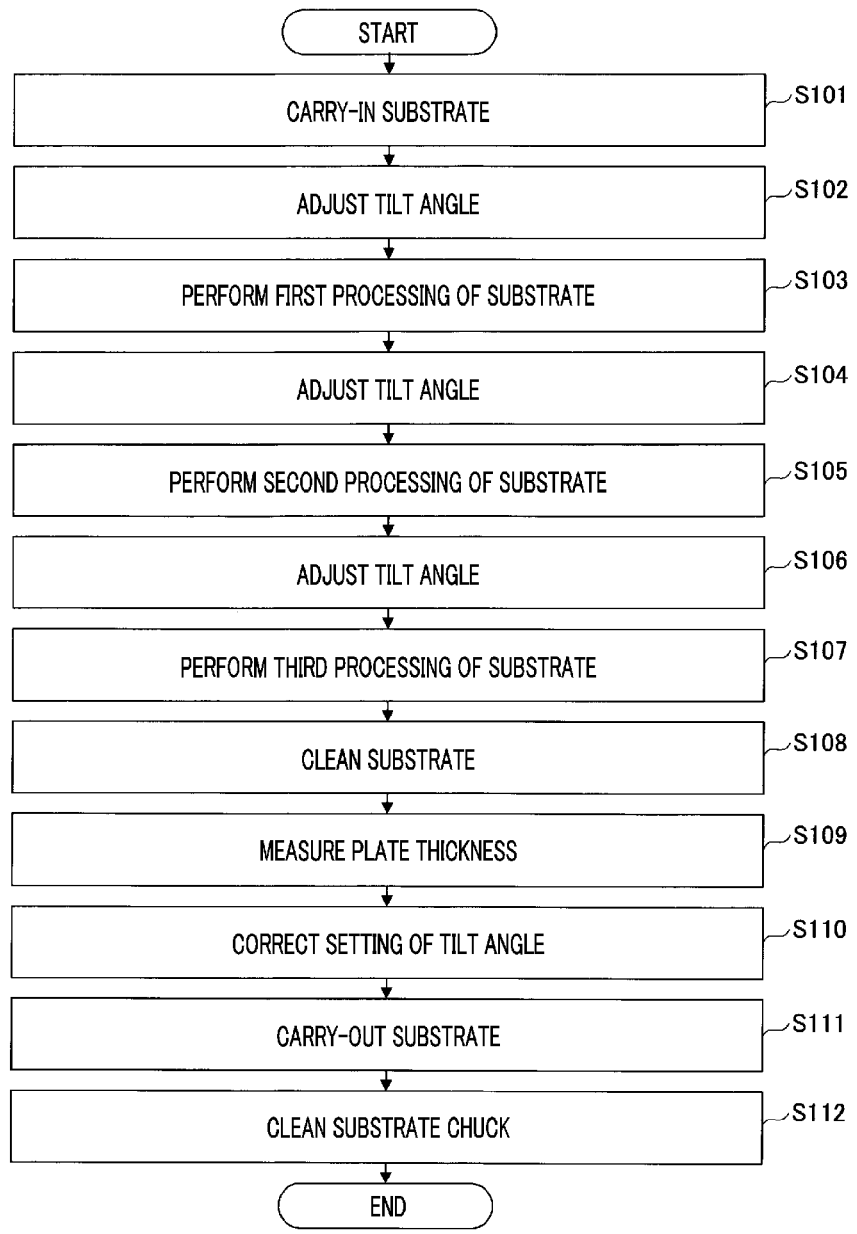
FIG. 11 is a flowchart illustrating a substrate processing method according to the exemplary embodiment.

FIG. 11 is a flowchart illustrating a substrate processing method according to an exemplary embodiment. Processes shown in FIG. 11 are processing steps performed on a substrate 2 held by the single substrate chuck 30A. Since processing steps performed on substrates 2 held by the other substrate chucks 30B, 30C and 30D are the same as those shown in FIG. 11, illustration thereof is omitted here. The processes S101 to S112 shown in FIG. 11 are repeatedly performed under the control of the controller 90 while substrates 2 are replaced. The processing steps on the substrate 2 held by the substrate chuck 30A and the processing steps on the substrates 2 held by the other substrate chucks 30B to 30D are performed in parallel.

The substrate processing method includes the process S101 of carrying in the substrate 2 onto the substrate chuck 30A. The substrate chuck 30A receives the substrate 2 from the transfer robot 3 at the carry-in/out position A0 and attracts the received substrate 2. Then, the substrate chuck 30A is moved from the carry-in/out position A0 to the first processing position A1 by being rotated along with the rotary table 20.

The substrate processing method includes the process S102 of adjusting the tilt angle of the substrate chuck 30A with respect to the rotary table 20. The adjustment of the tilt angle (process S102) only needs to be performed after the carrying-in of the substrate 2 (process S101), and it may be carried out before or in the middle of the moving of the substrate chuck 30A from the carry-in/out position A0 to the first processing position A1. The adjustment of the tilt angle (process S102) is performed prior to a first processing of the substrate 2 (process S103). The tilt angle controller 103 controls the tilt angle adjusting device 60 such that the Z1 and the Z2, for example, become set values Z1A and Z2A shown in FIG. 6. Further, the tilt angle controller 103 controls the tilt angle adjusting device 60 such that the α and the β become set values αA and βA shown in FIG. 7.

The substrate processing method includes the process S103 of performing the first processing of the substrate 2. The first processing of the substrate 2 is performed by the first processing device 40A at the first processing position A1. The substrate 2 is thinned to a preset plate thickness. Then, the substrate chuck 30A is moved to the second processing position A2 from the first processing position A1 by being rotated along with the rotary table 20.

The substrate processing method includes the process S104 of adjusting the tilt angle of the substrate chuck 30A with respect to the rotary table 20. The adjustment of the tilt angle (process S104) only needs to be performed after the first processing of the substrate 2 (process S103), and it may be carried out before or in the middle of the moving of the substrate chuck 30A from the first processing position A1 to the second processing position A2. The adjustment of the tilt angle (process S104) is performed prior to a second processing of the substrate 2 (process S105.) The tilt angle controller 103 controls the tilt angle adjusting device 60 such that the Z1 and the Z2, for example, become set values Z1B and Z2B shown in FIG. 6. Further, the tilt angle controller 103 controls the tilt angle adjusting device 60 such that the α and the β become set values αB and βB shown in FIG. 7.

The substrate processing method includes the process S105 of performing the second processing of the substrate 2. The second processing of the substrate 2 is performed by the second processing device 40B at the second processing position A2. The substrate 2 is thinned to a preset plate thickness. Thereafter, the substrate chuck 30A is moved from the second processing position A2 to the third processing position A3 by being rotated along with the rotary table 20.

The substrate processing method includes the process S106 of adjusting the tilt angle of the substrate chuck 30A with respect to the rotary table 20. The adjustment of the tilt angle (process S106) only needs to be performed after the second processing of the substrate 2 (process S105), and it may be carried out before or in the middle of the moving of the substrate chuck 30A from the second processing position A2 to the third processing position A3. The adjustment of the tilt angle (process S106) is performed prior to a third processing of the substrate 2 (process S107). The tilt angle controller 103 controls the tilt angle adjusting device 60 such that the Z1 and the Z2, for example, become set values Z1C and Z2C shown in FIG. 6. Further, the tilt angle controller 103 controls the tilt angle adjusting device 60 such that the α and the β become set values αC and βc shown in FIG. 7.

The substrate processing method includes the process S107 of performing the third processing of the substrate 2. The third processing of the substrate 2 is performed by the third processing device 40C at the third processing position A3. The substrate 2 is thinned to a preset plate thickness. Thereafter, the substrate chuck 30A is moved to the carry-in/out position A0 from the third processing position A3 by being rotated along with the rotary table 20.

The substrate processing method includes the process S108 of cleaning the substrate 2. The cleaning of the substrate 2 is performed by the substrate cleaning device 80 at the carry-in/out position A0. The substrate cleaning device 80 cleans the substrate 2 by supplying the cleaning liquid to the substrate 2 being rotated along with the substrate chuck 30. Accordingly, the substrate 2 can be carried out after the processing residue produced during the thinning of the substrate 2 is removed from the substrate 2.

The substrate processing method includes the process S109 of measuring the plate thickness of the substrate 2. The measuring of the plate thickness of the substrate 2 is performed by the plate thickness measuring device 70 at the carry-in/out position A0. The plate thickness measuring device 70 measures the plate thickness of the thinned substrate 2 at multiple points of the substrate 2 in the diametrical direction. The plate thickness distribution of the substrate 2 in the diametrical direction can be detected.

Although the plate thickness measurement of the substrate 2 (process S109) may be performed prior to the cleaning of the substrate 2 (process S108), it is performed after the cleaning of the substrate 2 (process S108) in the present exemplary embodiment. According to the present exemplary embodiment, since the plate thickness of the substrate 2 is measured after the processing residue produced during the thinning of the substrate 2 is removed from the substrate 2, the deterioration of the accuracy of the plate thickness measurement that might be caused by the processing residue can be suppressed.

The substrate processing method includes the process S110 of correcting the setting of the tilt angle of the substrate chuck 30A with respect to the rotary table 20 based on the measurement result of the plate thickness measurement of the substrate 2 (process S109). The correction of the setting of the tilt angle (process S110) is performed by the tilt angle controller 103. The setting to be corrected is the Z1C and Z2C shown in FIG. 6 or the αC and βc shown in FIG. 7. That is, the setting to be corrected is the setting of the tilt angle at the third processing position A3. As will be elaborated later, the tilt angle controller 103 does not correct but maintains the setting of the tilt angle at the first processing position A1 and the setting of the tilt angle at the second processing position A2.

The tilt angle controller 103 corrects the setting of the tilt angle at the third processing position A3 based on the measurement result of the plate thickness measurement of the substrate 2 after being subjected to the third processing. If the tilt angle is changed, the distribution of the contact pressure between the whetstone 6 and the substrate 2 on the trajectory 7 of the whetstone 6 shown in FIG. 3 is also changed. At the position where the contact pressure is high, the thinning of the substrate 2 progresses more, as compared to the position where the contact pressure is low. The tilt angle controller 103 corrects the setting of the tilt angle at the third processing position A3 such that a measurement value of a plate thickness of a next substrate 2 to be thinned through a next third processing (process S107) falls within a tolerance range.

The tilt angle controller 103 adjusts the tilt angle in a next adjustment of the tilt angle (process S106) based on the result of the current correction of the setting of the tilt angle (process S110). Thus, the measurement value of the plate thickness of the next substrate 2 to be thinned through the next third processing (process S107) is allowed to fall within the tolerance range.

The correction of the setting of the tilt angle may be performed when the contact pressure between the whetstone 6 and the substrate 2 is changed due to a wear-out of the whetstone 6, for example. Further, the correction of the tilt angle may be performed when the contact pressure between the whetstone 6 and the substrate 2 is changed due to a structural change of the substrate 2. For example, the structural change of the substrate 2 occurs when a dummy substrate without having a device thereon is first used as the substrate 2 and a product substrate having a device formed thereon is then used as the substrate 2. The dummy substrate is first used as the substrate 2 for the purpose of reducing a waste of the product substrate.

If the measurement value of the plate thickness of the substrate 2 after being subjected to the third processing falls within the tolerance range, the tilt angle controller 103 does not correct the tilt angle at the third processing position A3 but maintains the current tilt angle. The tolerance range is decided based on a variation of the contact pressure between the whetstone 6 and the substrate 2 due to an external factors such as a machine vibration or the like. The tolerance range is set for each measurement point. When the measurement values at all the measurement points are within the tolerance range, the tilt angle controller 103 does not correct the setting of the tilt angle but maintains it. Thus, unnecessary coping with the external factors can be suppressed.

Based on the measurement result of the plate thickness measurement of the substrate 2 after being subjected to the third processing, the tilt angle controller 103 maintains the setting (for example, the parameters Z1A and Z2A shown in FIG. 6 or the αA and the βA shown in FIG. 7) of the tilt angle at the first processing position A1 without correcting it. Further, based on the measurement result of the plate thickness measurement of the substrate 2 after being subjected to the third processing, the tilt angle controller 103 maintains the setting (for example, the parameters Z1B and Z2B shown in FIG. 6 or the αB and the βB shown in FIG. 7) of the tilt angle at the second processing position A2 without correcting it. If the processing conditions for the first processing and the processing conditions for the second processing are changed, the plate thickness distribution of the substrate 2 at the beginning of the third processing may be changed. As a result, the measurement value of the plate thickness of the next substrate 2 to be thinned by the next third processing (process S107) may fall out of the tolerance range even if the setting of the tilt angle at the third processing position A3 is corrected.

The substrate processing method includes the process S111 of carrying out the substrate 2 from the substrate chuck 30A. At the carry-in/out position A0, the substrate chuck 30A releases the attraction of the substrate 2 and hands the substrate 2 over to the transfer robot 3. The transfer robot 3 carries out the received substrate 2.

The substrate processing method includes the process S112 of cleaning the substrate chuck 30A. The substrate chuck 30A is cleaned by the chuck cleaning device 82 at the carry-in/out position A0. Thereafter, a carry-in of the new substrate 2 (process S101) is performed again. Since the new substrate 2 is attracted and held by the cleaned substrate chuck 30A, the substrate 2 is suppressed from having the flaw.

Figure 12:
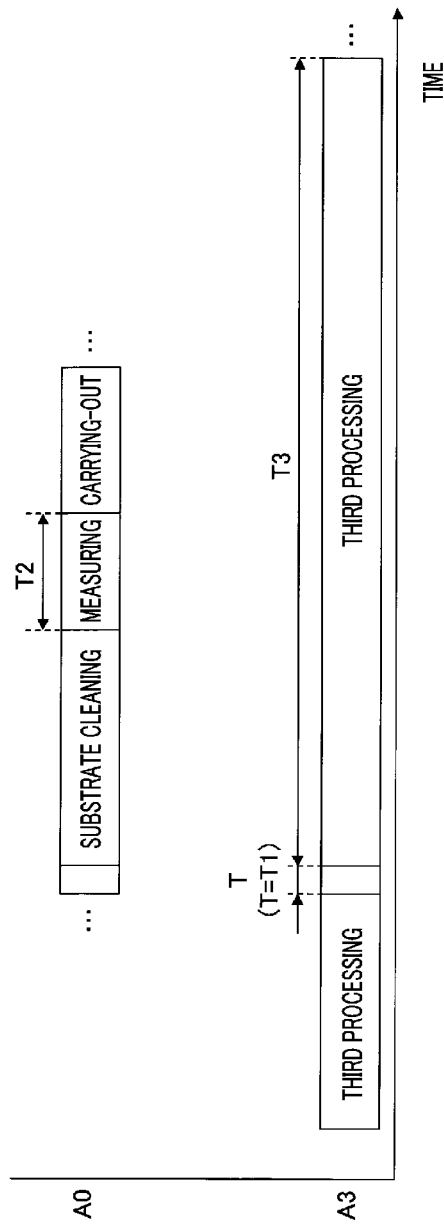
FIG. 12 is a diagram illustrating processings performed at a carry-in/out position and a third processing position at the same time according to the exemplary embodiment.
Figure 13:
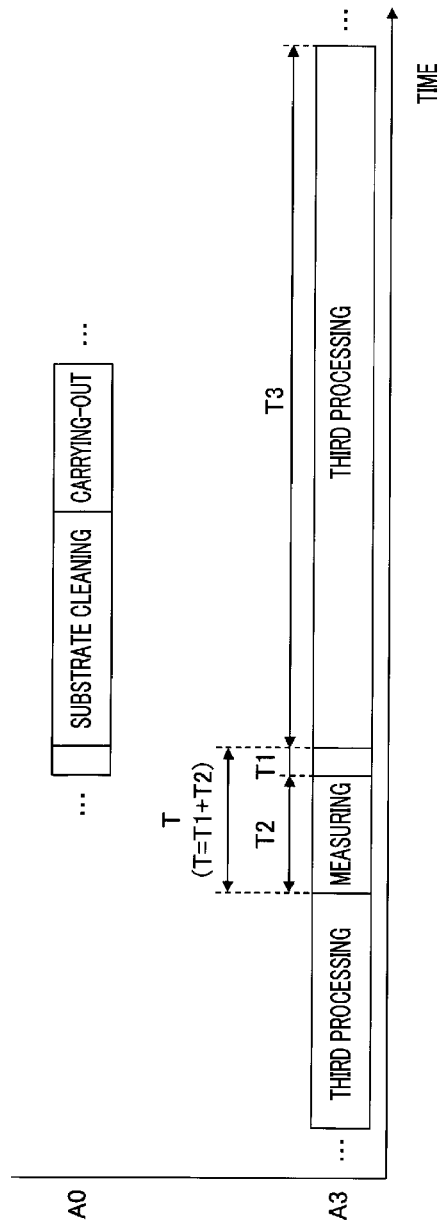
FIG. 13 is a diagram illustrating processings conventionally performed at a carry-in/out position and a third processing position at the same time.

FIG. 12 is a diagram showing processings performed at the carry-in/out position and the third processing position at the same time according to the exemplary embodiment. FIG. 13 is a diagram showing processings conventionally performed at the carry-in/out position and the third processing position at the same time.

As depicted in FIG. 13, conventionally, the plate thickness measurement (process S109) is performed at the third processing position A3. As a result, a standby time T at the third processing position A3 is long. The standby time T refers to a time from an end of the third processing of the substrate 2 held by the single substrate chuck 30 (for example, the substrate chuck 30A) to a beginning of the third processing of the substrate 2 held by another substrate chuck 30 (for example, the substrate chuck 30B). The standby time T includes a time T2 taken for the plate thickness measurement (process S109) in addition to a time T1 during which the rotary table 20 is rotated. Since the standby time T includes the time T2 taken for the plate thickness measurement (process S109), the standby time T is long.

Meanwhile, as shown in FIG. 12, the plate thickness measurement (process S109) is performed at the carry-in/out position A0 in the present exemplary embodiment. Therefore, the standby time T at the third processing position A3 can be shortened as the standby time T according to the present exemplary embodiment does not include the time T2 taken for the plate thickness measurement (process S109). The plate thickness measurement (process S109) upon the substrate 2 at the carry-in/out position A0 is performed while the third processing (process S107) upon another substrate 2 at the third processing position A3 is being performed. Further, a time T3 taken for the third processing (process S107) is longer than the time T2 taken for the plate thickness measurement (process S109). According to the present exemplary embodiment, since the standby time T at the third processing position A3 can be shortened, the number of substrates 2 processed per unit time can be increased.

So far, the exemplary embodiment of the substrate processing apparatus and the substrate processing method according to the present disclosure have been described. However, the present disclosure is not limited to the above-described exemplary embodiment or the like. Various changes, corrections, replacements, addition, deletion and combinations may be made within the scope of the claims, and all of these are included in the scope of the inventive concept of the present disclosure.

The tilt angle controller 103 of the above-described exemplary embodiment does not correct the setting of the tilt angle at the first processing position A1 and the setting of the tilt angle at the second processing position A2. However, the present disclosure is not limited thereto.

The setting of the tilt angle at the first processing position A1 may be corrected in the following case, for example. The substrate chuck 30 is moved to the carry-in/out position A0 from the first processing position A1. The plate thickness measuring device 70 measures the plate thickness of the substrate 2, which is immediately after being thinned at the first processing position A1, at multiple points of the substrate 2 in the diametrical direction thereof. The tilt angle controller 103 corrects the setting of the tilt angle at the first processing position A1 based on the measurement result of the plate thickness measuring device 70. The substrate 2 the plate thickness of which is measured for this correction is carried out without being subjected to the second processing.

Further, if the measurement range of the plate thickness measuring device 70 is small and the plate thickness measuring device 70 is not capable of measuring the plate thickness immediately after the first processing, the plate thickness measurement immediately after the first processing may be performed by an external plate thickness measuring device provided at the outside of the substrate processing apparatus 10. In this case, the tilt angle controller 103 corrects the setting of the tilt angle at the first processing position A1 based on the measurement result of this external plate thickness measuring device.

Likewise, the setting of the tilt angle at the second processing position A2 may be corrected in the following case, for example. The substrate chuck 30 is moved to the carry-in/out position A0 from the second processing position A2. The plate thickness measuring device 70 measures the plate thickness of the substrate 2, which is immediately after being thinned at the second processing position A2, at multiple points of the substrate 2 in the diametrical direction thereof. The tilt angle controller 103 corrects the setting of the tilt angle at the second processing position A2 based on the measurement result of the plate thickness measuring device 70. The substrate 2 the plate thickness of which is measured for this correction is carried out without being subjected to the third processing.

Further, if the measurement range of the plate thickness measuring device 70 is small and the plate thickness measuring device 70 is not capable of measuring the plate thickness immediately after the second processing, the plate thickness measurement immediately after the second processing may be performed by an external plate thickness measuring device provided at the outside of the substrate processing apparatus 10. In this case, the tilt angle controller 103 corrects the setting of the tilt angle at the second processing position A2 based on the measurement result of this external plate thickness measuring device.

The substrate chuck 30 is moved to the carry-out position from an $m^{th}$ (m is a natural number equal to or larger than 1) processing position. The plate thickness measuring device 70 measures, at multiple points of the substrate 2 in the diametrical direction thereof, the plate thickness of the substrate 2 immediately after being thinned at the $m^{th}$ processing position. The controller 103 corrects the setting of the tilt angle at the $m^{th}$ processing position based on the measurement result of the plate thickness measuring device 70. The setting of the tilt angle at the $m^{th}$ processing position can be appropriately corrected.

The substrate chuck 30 is moved to the carry-out position from an $n^{th}$ (n is a natural number equal to or larger than 2) processing position. The plate thickness measuring device 70 measures, at multiple points of the substrate 2 in the diametrical direction thereof, the plate thickness of the substrate 2 thinned at the $n^{th}$ processing position. The tilt angle controller 103 corrects the setting of the tilt angle at the $n^{th}$ processing position based on the measurement result of the plate thickness measuring device 70. The settings of the tilt angle at the first to $(n-1)^{th}$ processing positions are maintained without being corrected.

To elaborate, when n equals to, e.g., 3, the setting of the tilt angle at the first processing position and the setting of the tilt angle at the second processing position are maintained without being corrected. If the processing condition for the first processing and the processing condition for the second processing are changed, the plate thickness distribution of the substrate 2 at the beginning of the third processing may be changed. As a result, even if the setting of the tilt angle at the third processing position is corrected, the measurement value of the plate thickness of the substrate 2 to be thinned by the next third processing may fall out of the tolerance range.

Further, when n equals to 2, the setting of the tilt angle at the first processing position is maintained without being corrected. If the processing condition of the first processing is changed, the plate thickness distribution of the substrate 2 at the beginning of the second processing may be changed. As a result, even if the setting of the tilt angle at the second processing position is corrected, the measurement value of the plate thickness of the substrate 2 to be thinned by the next second processing may fall out of the tolerance range.

The substrate chuck 30 is moved to the carry-out position from the $m^{th}$ (m is a natural number equal to or larger than 1) processing position. The plate thickness measuring device 70 measures, at the multiple points of the substrate 2 in the diametrical direction thereof, the plate thickness of the substrate 2 immediately after the thinning at the $m^{th}$ processing position is ceased. The tilt angle controller 103 corrects the setting of the tilt angle at a time when the thinning at the $m^{th}$ processing position once ceased is resumed. The tilt angle controller 103 corrects the tilt angle according to the corrected setting before the ceased thinning is resumed. Since the tilt angle can be appropriately changed during the thinning, the waste of the substrate 2 can be reduced.

In the above-described exemplary embodiment, the carry-in/out position A0, the first processing position A1, the second processing position A2 and the third processing position A3 are arranged around the rotation axis 20Z of the rotary table 20 in this sequence in a counterclockwise direction. However, the present disclosure is not limited thereto. By way of example, the carry-in/out position A0, the first processing position A1, the second processing position A2 and the third processing position A3 may be arranged around the rotation axis 20Z of the rotary table 20 in this sequence in a clockwise direction.

Further, the carry-in position, the first processing position, the second processing position and the carry-out position may be arranged around the rotation axis 20Z of the rotary table 20 in this sequence in the counterclockwise direction or in the clockwise direction. The substrate 2 is carried in at the carry-in position, subjected to the first processing at the first processing position, subjected to the second processing at the second processing position, and carried out at the carry-out position.

Furthermore, a first carry-in/out position, a second carry-in/out position, a first processing position and a second processing position may be arranged around the rotation axis 20Z of the rotary table 20 in this sequence in the counterclockwise direction or in the clockwise direction. One substrate 2 is carried in at the first carry-in/out position, thinned at the first processing position, and carried out at the first carry-in/out position. Another substrate 2 is carried in at the second carry-in/out position, thinned at the second processing position, and carried out at the second carry-in/out position. The substrates 2 are carried in/out at the first carry-in/out position and the second carry-in/out position at the same time.

The substrate 2 is not limited to the semiconductor substrate such as a silicon wafer, and may be a glass substrate or the like.

This application claims priority to Japanese Patent Application No. 2018-237690, field on Dec. 19, 2018, which application is hereby incorporated by reference in their entirety.

According to the exemplary embodiments, it is possible to increase the number of substrates processed per unit time.

We claim:
1. A substrate processing apparatus, comprising:
   a rotary table configured to move each of multiple substrate chucks to, in sequence, a carry-in position where a carry-in of a substrate is performed, a processing position where thinning of the substrate is performed, and a carry-out position where a carry-out of the substrate is performed;
two connectors, connecting the substrate chuck and the rotary table, configured to linearly move to adjust a tilt angle of the substrate chuck with respect to the rotary table at the processing position;
a spindle shaft including a flange at an end thereof, wherein a whetstone is attached to the flange in a replaceable manner, and the whetstone is configured to thin the substrate at the processing position;
a laser displacement sensor provided at the carry-out position and configured to measure, at multiple points of the substrate in a diametrical direction thereof, a plate thickness of the substrate thinned by the whetstone; and
a controller and a storage including a program, wherein the storage and the program are configured, with the controller, to control the substrate processing apparatus,
wherein the controller is configured to:
control the laser displacement sensor to measure the plate thickness of the substrate, which has been thinned by the whetstone, at the carry-out position;
after measuring the plate thickness of the substrate and before thinning another substrate, control the two connectors to adjust the substrate chuck that holds said another substrate based on a plate thickness measurement result of the substrate; and
control the spindle shaft to thin said another substrate while said another substrate is held by the substrate chuck tilted at the adjusted angle.

2. The substrate processing apparatus of claim 1, wherein the controller measures a plate thickness of said another substrate while the controller is performing the thinning of the substrate.

3. The substrate processing apparatus of claim 1, further comprising:
a nozzle configured to clean the substrate at the carry-out position, and
wherein the controller cleans the substrate before the plate thickness of the substrate is measured by the laser displacement sensor.

4. The substrate processing apparatus of claim 1, further comprising:
a motor configured to move the laser displacement sensor between a measurement position where the laser displacement sensor measures the plate thickness of the substrate and a measurement standby position where the laser displacement sensor stands by to avoid a cleaning liquid configured to clean the substrate.

5. The substrate processing apparatus of claim 1, wherein the controller does not correct a setting of the tilt angle but maintains the setting thereof when a measurement value of the plate thickness of the substrate falls within a tolerance range.

6. The substrate processing apparatus of claim 1, wherein the substrate chuck is moved to the carry-out position from an $m^{th}$ (m is a natural number equal to or larger than 1) processing position,
the laser displacement sensor measures, at the multiple points of the substrate in the diametrical direction thereof, the plate thickness of the substrate immediately after being thinned at the $m^{th}$ processing position, and
the controller corrects a setting of the tilt angle at the $m^{th}$ processing position based on a measurement result of the laser displacement sensor.

7. The substrate processing apparatus of claim 1, wherein the substrate chuck is moved to the carry-out position from an $n^{th}$ (n is a natural number equal to or larger than 2) processing position,
the laser displacement sensor measures, at the multiple points of the substrate in the diametrical direction thereof, the plate thickness of the substrate thinned at the $n^{th}$ processing position, and
the controller corrects a setting of the tilt angle at the $n^{th}$ processing position based on a measurement result of the laser displacement sensor, and does not correct but maintains settings of the tilt angle at a first processing position to a $(n-1)^{th}$ processing position.

8. The substrate processing apparatus of claim 1, wherein the substrate chuck is moved to the carry-out position from an $m^{th}$ (m is a natural number equal to or larger than 1) processing position,
the laser displacement sensor measures, at the multiple points of the substrate in the diametrical direction thereof, the plate thickness of the substrate immediately after the thinning at the $m^{th}$ processing position is ceased, and
the controller corrects a setting of the tilt angle at a time when the thinning once ceased at the $m^{th}$ processing position is resumed.

9. The substrate processing apparatus of claim 1, wherein the carry-in position and the carry-out position are identical.

10. A substrate processing method performed by the substrate processing apparatus of claim 1, the substrate processing method comprising:
moving, by the rotary table, each of multiple substrate chucks to, in sequence, the carry-in position where the carry-in of a substrate is performed, the processing position where thinning of the substrate is performed, and the carry-out position where a carry-out of the substrate is performed;
adjusting, by the two connectors, the tilt angle of the substrate chuck with respect to the rotary table at the processing position;
thinning, by the whetstone, the substrate at the processing position;
measuring, by the laser displacement sensor, at multiple points of the substrate in the diametrical direction thereof, the plate thickness of the substrate thinned at the processing position; and
correcting, by the controller, a setting of the tilt angle at the processing position based on the measurement result of the measuring of the plate thickness of the substrate,
wherein the measuring of the plate thickness of the substrate is performed at the carry-out position, and
wherein the substrate processing method further comprises:
after measuring the plate thickness of the substrate and before thinning another substrate, adjusting the substrate chuck that holds said another substrate based on a plate thickness measurement result of the substrate; and
thinning said another substrate while said another substrate is held by the substrate chuck tilted at the adjusted angle.

11. The substrate processing method of claim 10,
wherein the measuring of the plate thickness of the substrate at the carry-out position is performed while thinning another substrate at the processing position.

12. The substrate processing method of claim 10, further comprising:
cleaning the substrate at the carry-out position before the measuring of the plate thickness of the substrate at the carry-out position.

13. The substrate processing method of claim 10, further comprising:
moving the laser displacement sensor configured to measure the plate thickness of the substrate between a measurement position where the laser displacement sensor measures the plate thickness of the substrate and a measurement standby position where the laser displacement sensor stands by to avoid a cleaning liquid configured to clean the substrate.

14. The substrate processing method of claim 10,
wherein the setting of the tilt angle is maintained without being corrected when a measurement value of the plate thickness of the substrate falls within a tolerance range.

15. The substrate processing method of claim 10,
wherein the substrate chuck is moved to the carry-out position from an $m^{th}$ (m is a natural number equal to or larger than 1) processing position,
in the measuring of the plate thickness of the substrate, the plate thickness of the substrate immediately after being thinned at the $m^{th}$ processing position is measured at the multiple points of the substrate in the diametrical direction thereof, and
in the correcting of the setting of the tilt angle, the setting of the tilt angle at the $m^{th}$ processing position is corrected based on a measurement result in the measuring of the plate thickness of the substrate.

16. The substrate processing method of claim 10,
wherein the substrate chuck is moved to the carry-out position from an $n^{th}$ (n is a natural number equal to or larger than 2) processing position,
in the measuring of the plate thickness of the substrate, the plate thickness of the substrate thinned at the $n^{th}$ processing position is measured at the multiple points of the substrate in the diametrical direction thereof, and
in the correcting of the setting of the tilt angle, the setting of the tilt angle at the $n^{th}$ processing position is corrected based on a measurement result in the measuring of the plate thickness of the substrate, and settings of the tilt angle at a first processing position to a $(n-1)^{th}$ processing position are not corrected but maintained.

17. The substrate processing method of claim 10,
wherein the substrate chuck is moved to the carry-out position from a $m^{th}$ (m is a natural number equal to or larger than 1) processing position,
in the measuring of the plate thickness of the substrate, the plate thickness of the substrate immediately after the thinning at the $m^{th}$ processing position is ceased is measured at the multiple points of the substrate in the diametrical direction thereof, and
in the correcting of the setting of the tilt angle, the setting of the tilt angle at a time when the thinning once ceased at the $m^{th}$ processing position is resumed is corrected based on a measurement result in the measuring of the plate thickness of the substrate.

18. The substrate processing method of claim 10,
wherein the carry-in position and the carry-out position are identical.

* * * * *